United States Patent
Takaoka

(10) Patent No.: US 6,881,984 B2
(45) Date of Patent: Apr. 19, 2005

(54) RESONANT-CAVITY LIGHT-EMITTING DIODE AND OPTICAL TRANSMISSION MODULE USING THE LIGHT-EMITTING DIODE

(75) Inventor: Keiji Takaoka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/660,666

(22) Filed: Sep. 12, 2003

(65) Prior Publication Data

US 2004/0046180 A1 Mar. 11, 2004

Related U.S. Application Data

(62) Division of application No. 10/092,434, filed on Mar. 8, 2002, now Pat. No. 6,661,031.

(30) Foreign Application Priority Data

Mar. 21, 2001 (JP) .................................. 2001-079981

(51) Int. Cl.[7] ...................... H01L 29/227; H01L 33/00; H01S 3/0933
(52) U.S. Cl. .................... 257/98; 257/95; 257/91; 257/25; 257/96; 257/103; 257/104; 257/183; 257/45; 359/344; 372/50; 372/20; 372/23; 372/96; 372/102; 372/92; 372/45; 372/49
(58) Field of Search ............................ 257/98, 95, 91, 257/45, 46, 49, 184, 185, 458, 12, 21, 656, 335, 328, 183, 191, 200, 25, 96, 103, 104; 359/344; 372/50, 20, 23, 96, 92, 45

(56) References Cited

U.S. PATENT DOCUMENTS

| | | | |
|---|---|---|---|
| 5,042,049 A | 8/1991 | Ohtoshi et al. | |
| 5,226,053 A * | 7/1993 | Cho et al. | 372/45 |
| 5,753,940 A | 5/1998 | Komoto | |
| 5,822,351 A | 10/1998 | Kang | |
| 6,063,643 A | 5/2000 | Dutta | |
| 6,069,908 A | 5/2000 | Yuen et al. | |
| 6,088,376 A * | 7/2000 | O'Brien et al. | 372/50 |
| 6,111,904 A | 8/2000 | Takano | |
| 6,225,648 B1 | 5/2001 | Hsieh et al. | |
| 6,339,496 B1 * | 1/2002 | Koley et al. | 359/344 |
| 6,765,238 B1 * | 7/2004 | Chang et al. | 257/104 |
| 2002/0106160 A1 * | 8/2002 | Cox et al. | 385/49 |

FOREIGN PATENT DOCUMENTS

JP  07131066 A  5/1995

\* cited by examiner

*Primary Examiner*—Alexander Oscar Williams
(74) *Attorney, Agent, or Firm*—Oblon, Spivak, McClelland, Maier & Neustadt, P.C.

(57) ABSTRACT

A resonant-cavity light-emitting diode includes a semiconductor light-emitting layer sandwiched between an under and an upper semiconductor distributed Bragg reflector mirror layer, which are formed on the substrate, a light extracting section formed on the upper semiconductor distributed Bragg reflector mirror layer and having an opening to extract light from the semiconductor light-emitting layer, and a groove formed by removing portions of the semiconductor light-emitting layer, under and upper semiconductor distributed Bragg reflector mirror layers which lie in a peripheral portion of the opening of the light extraction section and reach the under semiconductor distributed Bragg reflector mirror layer, the inner wall of the groove being formed to reflect part of light emitted from the semiconductor light-emitting layer into the groove.

7 Claims, 4 Drawing Sheets

RESONANT-CAVITY LIGHT-EMITTING DIODE AND OPTICAL TRANSMISSION MODULE USING THE LIGHT-EMITTING DIODE

CROSS-REFERENCE TO RELATED APPLICATIONS

This application is a division of application Ser. No. 10/092,434 filed Mar. 8, 2002, now U.S. Pat. No. 6,661,031.

This application is based upon and claims the benefit of priority from the prior Japanese Patent Application No. 2001-079981, filed Mar. 21, 2001, the entire contents of which are incorporated herein by reference.

BACKGROUND OF THE INVENTION

1. Field of the Invention

This invention relates to a resonant-cavity light-emitting diode which emits light in a direction perpendicular to one main surface of a substrate.

2. Description of the Related Art

A resonant-cavity light-emitting diode is a light-emitting device having a structure similar to that of a vertical-cavity surface emitting laser and is operated with laser oscillation suppressed by setting the reflectance on the light-emitting side low appropriately. As this type of light-emitting device, for example, a device disclosed in IEEE PHOTONICS TECHNOLOGY LETTERS, VOL. 10, NO. 12, pp. 1685 to 1687, Dec. 12, 1998, is known.

The resonant-cavity light-emitting diode has features in comparison with a normal LED since it has a cavity structure that (1) the emission spectral line width is narrow, (2) the directivity of emitted light is high, and (3) the carrier lifetime of spontaneous emission is short.

Therefore, the resonant-cavity light-emitting diode is extremely suitably used as a transmission light source for an optical LAN and an optical data link. It is a light transmission device which plays an important role, particularly, in the transmission rate of approximately 100 Mbps to 1 Gbps and the response characteristics thereof largely depend on the device size.

That is, as the device size becomes smaller, the carrier density of an active layer caused when the same amount of current is injected therein becomes higher, and the carrier lifetime which controls the response characteristics of the light-emitting diode becomes shorter as the carrier density becomes higher. Therefore, generally, the response characteristics of the device become higher as the device size becomes smaller.

However, a reduction in the device size means that the light-emitting area of the device is made small and there occurs a problem that light output power is lowered accordingly as the device size is reduced.

One of the main factors in lowering the light output power due to reduction in the device size is considered as follows. That is, since the resonant-cavity light-emitting diode is a device which emits light in a direction perpendicular to one main surface of the substrate on a flat plate, the light-emitting area on the main surface of the substrate is reduced with reduction in the device size. Therefore, the ratio of the area on the substrate side surface to the plane area of an effective active region which contributes to light emission becomes higher and the rate of light leaking into the substrate side surface side becomes higher.

Thus, the conventional resonant-cavity light-emitting diode has a problem that the light output power is lowered if the device size is reduced in order to enhance the response characteristics of the device. Therefore, it is required to realize a resonant-cavity light-emitting diode which generates high light output power and is excellent in its response characteristics.

BRIEF SUMMARY OF THE INVENTION

A resonant-cavity light-emitting diode according to a first aspect of this invention comprises a substrate having first and second main surfaces which are substantially parallel to each other, a first semiconductor distributed Bragg reflector mirror layer formed on the first main surface of the substrate, a semiconductor light-emitting layer formed over the first semiconductor distributed Bragg reflector mirror layer, a second semiconductor distributed Bragg reflector mirror layer formed over the semiconductor light-emitting layer, a light-extracting section which is formed on the second semiconductor distributed Bragg reflector mirror layer and having an opening to extract light from the semiconductor light-emitting layer, a first electrode formed around the opening of the light-extracting section on the second semiconductor distributed Bragg reflector mirror layer, a second electrode formed on the second main surface of the substrate, the second electrode being configured to form a current path leading to the first electrode through the first semiconductor distributed Bragg reflector mirror layer, semiconductor light-emitting layer and second semiconductor distributed Bragg reflector mirror layer, and a reflector portion provided on an-inner wall of a groove, the groove being formed by removing portions of the first semiconductor distributed Bragg reflector mirror layer, semiconductor light-emitting layer and second semiconductor distributed Bragg reflector mirror layer which lie in a peripheral portion of the first electrode and formed to penetrate through each of the semiconductor light-emitting layer and second semiconductor distributed Bragg reflector mirror layer and reach the first semiconductor distributed Bragg reflector mirror layer, the reflector portion being formed to reflect part of light emitted from the semiconductor light-emitting layer into the groove.

A resonant-cavity light-emitting diode according to a second aspect of this invention comprises a substrate having first and second main surfaces which are substantially parallel to each other, a first semiconductor distributed Bragg reflector mirror layer formed on the first main surface of the substrate, a semiconductor light-emitting layer formed over the first semiconductor distributed Bragg reflector mirror layer, a second semiconductor distributed Bragg reflector mirror layer formed over the semiconductor light-emitting layer, a light-extracting section which is formed on the second semiconductor distributed Bragg reflector mirror layer and has an opening to extract light from the semiconductor light-emitting layer, a first electrode formed around the opening of the light-extracting section on the second semiconductor distributed Bragg reflector mirror layer, a second electrode formed on the second main surface of the substrate, the second electrode being configured to form a current path leading to the first electrode through the first semiconductor distributed Bragg reflector mirror layer, semiconductor light-emitting layer and second semiconductor distributed Bragg reflector mirror layer, and a reflector portion provided on an inner wall of a groove, the groove being formed by removing portions of the first semiconductor distributed Bragg reflector mirror layer, semiconductor light-emitting layer and second semiconductor distributed Bragg reflector mirror layer which lie in a peripheral portion of the first electrode and formed to penetrate through each of the semiconductor light-emitting layer and second semiconductor distributed Bragg reflector mirror layer and reach the first semiconductor distributed Bragg reflector mirror layer, the reflector portion being formed to reflect part of light emitted from the semiconductor light-emitting layer into the groove, and a high-resistance region which is formed to reach the inner wall of the groove and formed by making portions of the first and second semiconductor distributed Bragg reflector mirror layers other than at least portions thereof which lie under and below the light-extracting section electrically highly resistive.

An optical transmission module according to a third aspect of this invention comprises a resonant-cavity light-emitting diode according to the first aspect and an optical fiber on which light from the light-extracting section and groove of the resonant-cavity light-emitting diode is incident.

DETAILED DESCRIPTION OF THE INVENTION

Figure 1:
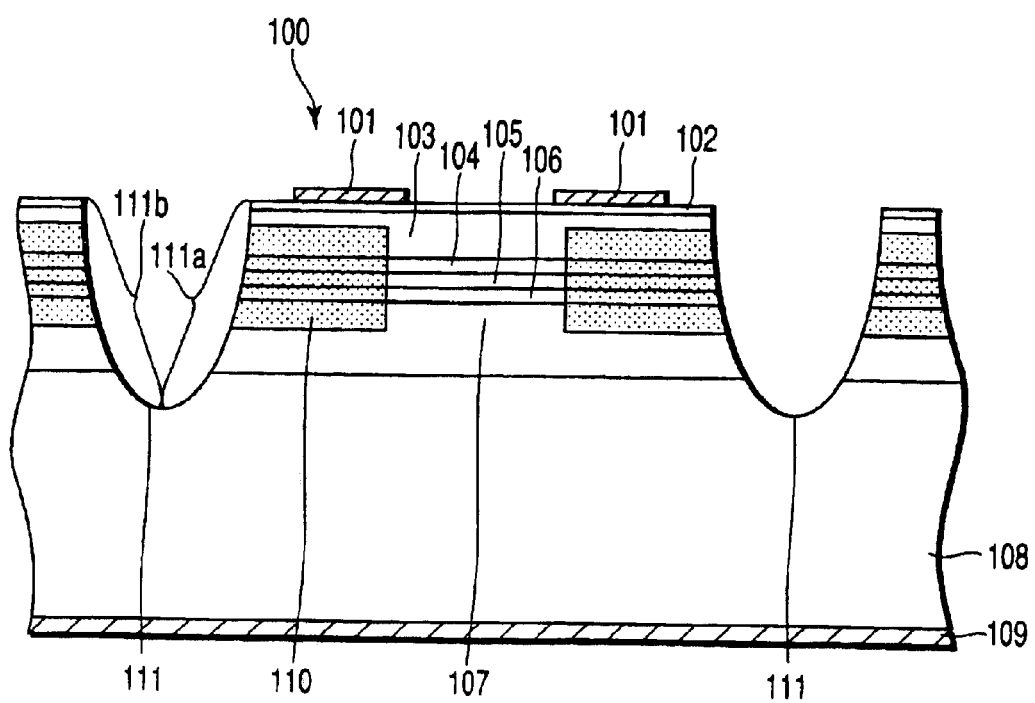
FIG. 1 is a cross-sectional view showing the structure of a resonant-cavity light-emitting diode according to a first embodiment of this invention.

In a resonant-cavity light-emitting diode according to a first aspect of this invention, a groove which reaches a first (lower) semiconductor distributed Bragg reflector mirror layer is formed in a peripheral portion of a first electrode (on the light-emitting surface side). Therefore, part of the light emitted from a semiconductor light-emitting layer which leaks in a direction toward the side surface of the device (that is, in a direction different from the thickness direction of the semiconductor light-emitting layer) is emitted into the groove through a portion near the inner wall of the groove which lies on the first electrode side, repeatedly reflected from the inner wall surface of the groove and propagated in a direction toward the front surface of the device in which the groove is opened.

As a result, a large portion of light which is transmitted to the side surface of the semiconductor light-emitting layer and has been attenuated inside the conventional device can be effectively extracted in the resonant-cavity light-emitting diode with the above structure and the light output power of the device can be increased.

Further, in a resonant-cavity light-emitting diode according to another aspect of this invention, portions of first (lower) and second (upper) semiconductor distributed Bragg reflector mirror layers except at least portions of the above layers which lie under and below the light-extracting section are made electrically highly resistive, and the highly resistive portions of the first and second semiconductor distributed Bragg reflector mirror layers are formed to reach the inner wall of the groove.

In a resonant-cavity light-emitting diode with the above structure, since the groove which reaches the first semiconductor distributed Bragg reflector mirror layer is formed in the peripheral portion of a first electrode, part of the light emitted from the semiconductor light-emitting layer which leaks in a direction toward the side surface of the device (that is, in a direction different from the thickness direction of the semiconductor light-emitting layer) is emitted or radiated into the groove through a portion near the inner wall of the groove which lies on the first electrode side, repeatedly reflected from the inner wall surface of the groove and propagated in a direction toward the front surface of the device in which the groove is opened.

As a result, as in the resonant-cavity light-emitting diode of the first aspect, the light output power of the device can be increased. Further, since part of the inner wall surface of the groove is made highly resistive, a leakage current will not flow along the surface of the inner wall of the groove. Therefore, even if a protection film to prevent deterioration of the inner wall surface of the groove is not formed on the inner wall surface, a highly reliable device can be attained.

There will now be described embodiments of this invention with reference to the accompanying drawings.

(First Embodiment)

A first embodiment of this invention is a red resonant-cavity light-emitting diode having a light emission wavelength of approximately 665 nm and using an InGaAlP-based multiple quantum well structure as an active layer.

Figure 2:
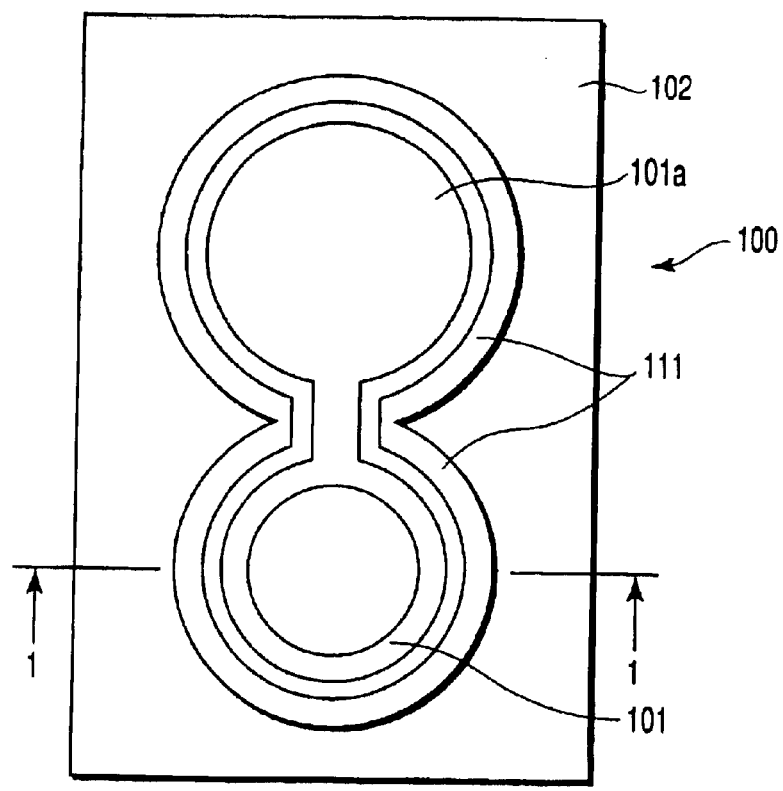
FIG. 2 is a top view showing the resonant-cavity light-emitting diode according to the first embodiment.

FIG. 1 is a cross-sectional view showing the schematic structure of a resonant-cavity light-emitting diode 100 according to the first embodiment. FIG. 2 shows the schematic structure of the top surface of the resonant-cavity light-emitting diode 100 shown in FIG. 1. The cross section taken along the 1—1 line in FIG. 2 corresponds to FIG. 1.

In the resonant-cavity light-emitting diode 100 according to the first embodiment, an n-type AlGaAs-based distributed Bragg reflector mirror 107 is formed on one main surface of an n-type GaAs substrate 108. The distributed Bragg reflector mirror is hereinafter referred to as a DBR mirror.

It is preferable to use a substrate which has a plane orientation (100) and whose axis is shifted by 10° to 15° as the GaAs substrate 108. This is applied to the embodiments described below.

On the DBR mirror 107, an n-type InGaAlP cladding layer 106, an InGaAlP-based multiple quantum well active layer 105 which is adjusted to have a light emission peak wavelength of 655 nm, a p-type InGaAlP cladding layer 104, an AlGaAs-based p-type DBR mirror 103 and a p-type GaAs contact layer 102 are sequentially grown by an MOCVD (metal organic chemical vapor deposition) method. The total optical film thickness of the cladding layers and multiple quantum well active layer is set to be coincident with the resonant wavelength (665 nm).

In the AlGaAs-based DBR mirrors 103 and 107, a structure in which layers of $Al_{0.98}Ga_{0.02}As$ and $Al_{0.5}Ga_{0.5}As$ are alternately accumulated and the optical film thickness of each later is set to be ¼ the resonant wavelength (665 nm).

In the n-side DBR mirror layer 107, a structure in which layers are repeatedly accumulated 30.5 times starting from $Al_{0.98}Ga_{0.02}As$ and in which the final layer is formed of $Al_{0.98}Ga_{0.02}As$ is used. On the other hand, in the p-side DBR mirror layer 103, a structure in which layers are repeatedly accumulated 10 times starting from $Al_{0.98}Ga_{0.02}As$ and in which the final layer is formed of $Al_{0.5}Ga_{0.5}As$ is used. Thus, the resonant wavelength of a cavity structure configured by the DBR mirrors below and above the active layer is set to 665 nm.

Further, in a region except a circular region having a diameter of 70 μm which is used as a light-emitting region, protons are selectively ion-implanted to form a high-resistance region 110 and a current confinement portion is provided. At this time, the condition for ion-implantation is that the acceleration energy is 200 keV and the dose is $1 \times 10^{15}$ cm$^{-2}$.

A p-side electrode 101 having a pattern as shown in FIG. 2 and a bonding pad 101a are formed on the surface of the p-type GaAs contact layer 102 which is the top layer of the semiconductor layers. As shown in the drawing, in the p-side electrode 101, a circular opening portion with a diameter of 60 μm is formed directly above the light-emitting region in order to extract light.

Further, a portion surrounding the p-side electrode 101 and bonding pad 101a is selectively etched in the GaAs substrate 108 to form a groove 111 having a substantially a U-shaped cross section.

A ring-like groove which is formed in the peripheral portion of the p-side electrode 101 surrounding at least the opening portion is formed to have a concave surface to reflect, in the groove, light which is part of light emitted from the current injection region lying below the opening portion of the p-side electrode 101 and which spreads in a direction toward the side surface of the device, and direct the light toward the front surface side of the device on which the p-side electrode 101 is provided while repeatedly reflecting the light as described above. The inner and outer diameters of the ring-like groove are respectively set to 100 μm and 140 μm, for example.

The cross section of the ring-like groove is not limited to substantially a U-shape, but may be set as a V-shape, and if the width thereof is made smaller in a portion nearer to the bottom of the groove, light can be efficiently extracted toward the front surface side. However, in order to direct light which spreads in a direction toward the side surface of the device to the front surface side of the device on which the p-side electrode 101 is provided, the ring-like groove is required to be formed with an inner sidewall portion 111a having the surface state described below and an outer sidewall portion 111b configured by the semiconductor layers left behind on the outer portion of the groove 111.

That is, the outer sidewall portion 111b is required to be a reflector which has such a surface state as to reflect light spreading toward the side surface of the device into the groove 111 or efficiently reflect the light toward the front surface side of the device.

On the other hand, the inner sidewall portion 111a is required to emit light which spreads toward the side surface of the device into the groove 111. In addition, when light emitted into the groove 111 is reflected from the outer sidewall portion 111b at an angle at which the light is incident on the inner sidewall portion 111a, the inner sidewall portion 111a is required to have such a surface state as to further reflect the light into the groove 111 or efficiently reflect the light toward the front surface side of the device.

In order to attain the surface states of the inner sidewall portion 111a and outer sidewall portion 111b, the smoothness of the surface in the groove 111, the inclinations of the portions extending from the bottom portion to the upper ends of the inner sidewall portion 111a and outer sidewall portion 111b, the curvatures of the surfaces of the inner sidewall portion 111a and outer sidewall portion 111b and the like are controlled in an adequate etching condition by taking the reflection effect into consideration.

Since the groove is formed in a ring-like form in the peripheral portion of the p-side electrode 101, it becomes possible to emit light in all directions toward the side surface of the semiconductor light-emitting layer and efficiently extract the light toward the front surface side of the device.

The rear surface of the n-type GaAs substrate 108 is subjected to a rear-surface polishing process and an n-side electrode 109 is formed on the entire rear surface.

In the thus-formed resonant-cavity light-emitting diode, since light which spreads toward the side surface of the device can be efficiently directed toward the front surface side of the device and extracted, the light output power can be increased.

Figure 3:
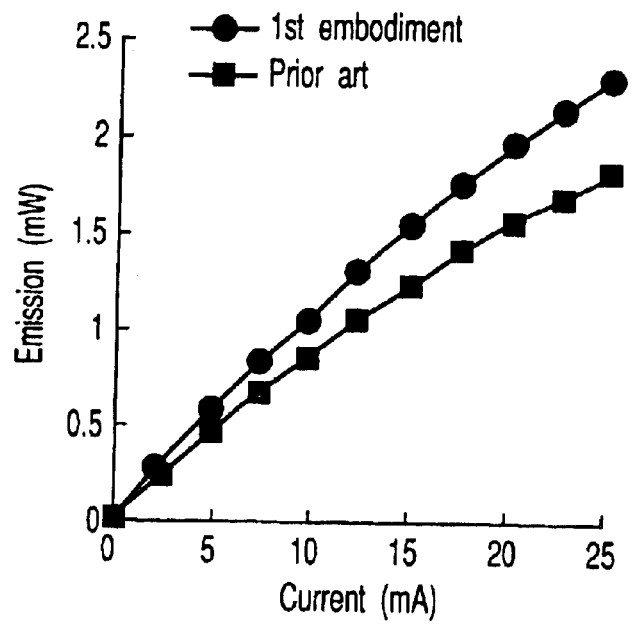
FIG. 3 is a light emission characteristic diagram which exhibits the effect of this invention.

FIG. 3 shows the light emission characteristics of the resonant-cavity light-emitting diode shown in FIG. 1 and the conventional resonant-cavity light-emitting diode in which the current is confined in a circular region of 70 μm. The curve formed by circular dots indicates the first embodiment and the curve formed by square dots indicates the light emission characteristics of a conventional resonant-cavity light-emitting diode. In the resonant-cavity light-emitting diode of the first embodiment in which a groove 111 is formed, it is confirmed that the light output power is increased by 20% at a current of 25 mA in comparison with the conventional case.

(Second Embodiment)

As in the first embodiment, a second embodiment is a red resonant-cavity light-emitting diode having a light emission wavelength of approximately 665 nm and using an InGaAlP-based multiple quantum well structure as an active layer.

Figure 4:
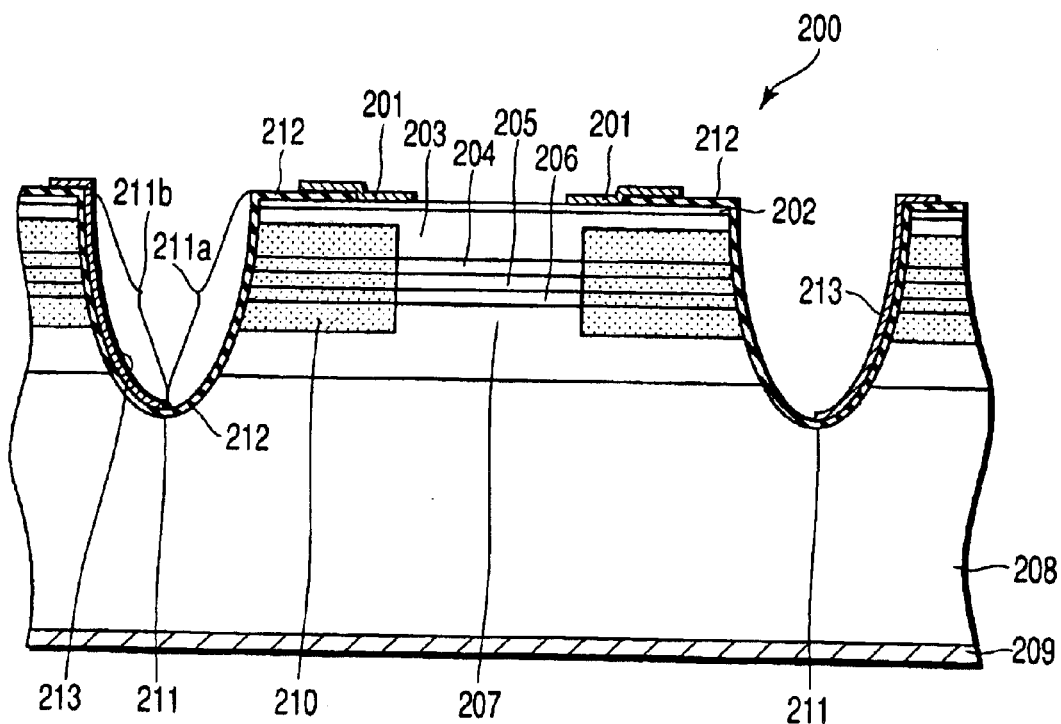
FIG. 4 is a cross-sectional view showing the structure of a resonant-cavity light-emitting diode according to a second embodiment of this invention.
Figure 5:
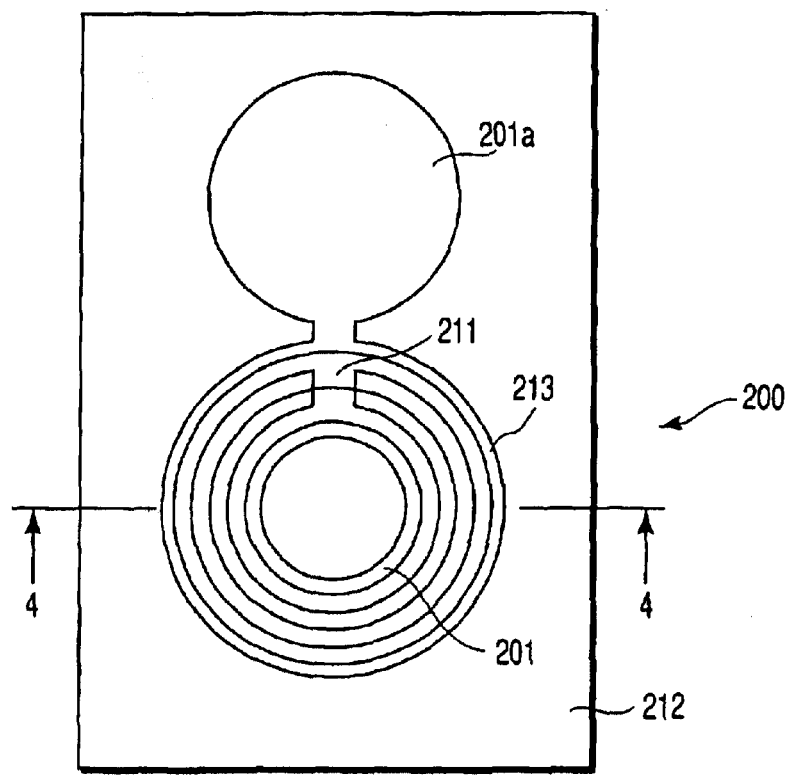
FIG. 5 is a top view showing the resonant-cavity light-emitting diode according to the second embodiment.

FIG. 4 is a cross-sectional view showing the schematic structure of a resonant-cavity light-emitting diode 200 according to the second embodiment. FIG. 5 shows the schematic structure of the top surface of the resonant-cavity light-emitting diode 200 shown in FIG. 4. The cross section taken along the 4—4 line in FIG. 5 corresponds to FIG. 4.

The resonant-cavity light-emitting diode 200 according to the second embodiment is different from that of the first embodiment in that a metal reflection film 213 which reflects light is provided on an outer sidewall portion 211b of a groove 211, the groove 211 is formed in a closed ring form, and an $SiO_2$ film 212 is provided in the groove 211 and the other structure is similar to that of the first embodiment.

Therefore, in the resonant-cavity light-emitting diode 200 according to the second embodiment, an n-type AlGaAs-based DBR mirror 207, an n-type InGaAlP cladding layer 206, an InGaAlP-based multiple quantum well active layer 205, a p-type InGaAlP cladding layer 204, an AlGaAs-based p-type DBR mirror 203, a p-type GaAs contact layer 202 and a current confinement portion formed of a high-resistance region 210 are provided on one main surface of an n-type GaAs substrate 208. Further, an n-side electrode 209 is formed on the entire portion of the polished rear surface of the n-type GaAs substrate 208.

In the second embodiment, a ring-form groove 211 having an inner diameter of 100 μm and an outer diameter of 140 μm is concentrically formed with respect to the current confinement portion from the surface of the p-type GaAs contact layer 202 by etching in the structure having a portion which ranges from the p-type GaAs contact layer 202 to the current confinement portion formed of the high-resistance region 210 and is formed in the same manner as in the first embodiment.

After the groove 211 is formed, the surface in the groove 211 and the surface of the p-type GaAs contact layer 202 are covered with an $SiO_2$ film 212 deposited by the CVD (Chemical Vapor Deposition) method. However, at least in a range of the diameter of 70 μm on the current confinement portion surrounded by the high-resistance region 210, the $SiO_2$ film 212 is partly removed in a circular form and the surface of the p-type GaAs contact layer 202 is exposed and used as an emitted light extraction portion.

Further, on the surface of the p-type GaAs contact layer 202, a ring-form p-side electrode 201 having an inner diameter of 60 μm and an outer diameter of 80 μm in the surface region is formed as a metal layer of TiPtAu, for example. In the second embodiment, the diameter of the current confinement portion is set to 62 μm.

The metal reflection film 213 which reflects light and is provided on the outer sidewall portion 211b of the groove 211 and a bonding pad 201a having a connecting portion 201b used for connection with the p-side electrode 201 and provided on the $SiO_2$ film 212 which lies outside the groove 211 are formed as metal layers of TiPtAu, for example.

The groove 211, p-side electrode 201, metal reflection film 213 and emitted light extraction portion are arranged concentrically with respect to the current confinement portion, but the metal layers of the p-side electrode 201, metal reflection film 213, bonding pad 201a and connecting portion 201b can be simultaneously formed by the following lift-off method.

That is, a resist film is first formed on a region on which the above metal film is not formed. The region on which the above metal film is not formed contains the emitted light extraction portion in which the surface of the p-type GaAs contact layer 202 on the current confinement portion is exposed, a portion on the $SiO_2$ film 212 which lies outside the peripheral edge (at a distance of 40 μm from the center of the ring-form electrode) of the p-side electrode 201, the inner sidewall portion 211a of the groove 211, and a portion on the $SiO_2$ film 212 which lies outside the groove 211 and from which a forming region of the bonding pad 201a and connecting portion 201b is omitted. After this, a TiPtAu layer is formed on the entire surface. In this state, by removing the resist layer together with the metal films formed thereon, the metal films are simultaneously patterned.

Finally, as in the case of the first embodiment, the rear surface is polished and an n-side electrode 209 is formed thereon.

As in the first embodiment, in the above resonant-cavity light-emitting diode 200, the light extraction efficiency can be enhanced by use of the groove 211. Further, since the metal reflection film 213 using the same metal layer as the p-side electrode 201 is formed on the outer sidewall portion 211b of the ring-form groove 211, light emitted into the groove is reflected from the reflection film on the inner wall of the groove and light in the groove is prevented from being incident on the internal portion of the semiconductor layers around the groove. Since the metal reflection film 213 is provided, the reflectance on the outer sidewall surface 211b of the groove 211 becomes higher than that in the first embodiment and it becomes possible to extract more efficiently light emitted into the groove toward the front surface side of the device.

(Third Embodiment)

Figure 6:
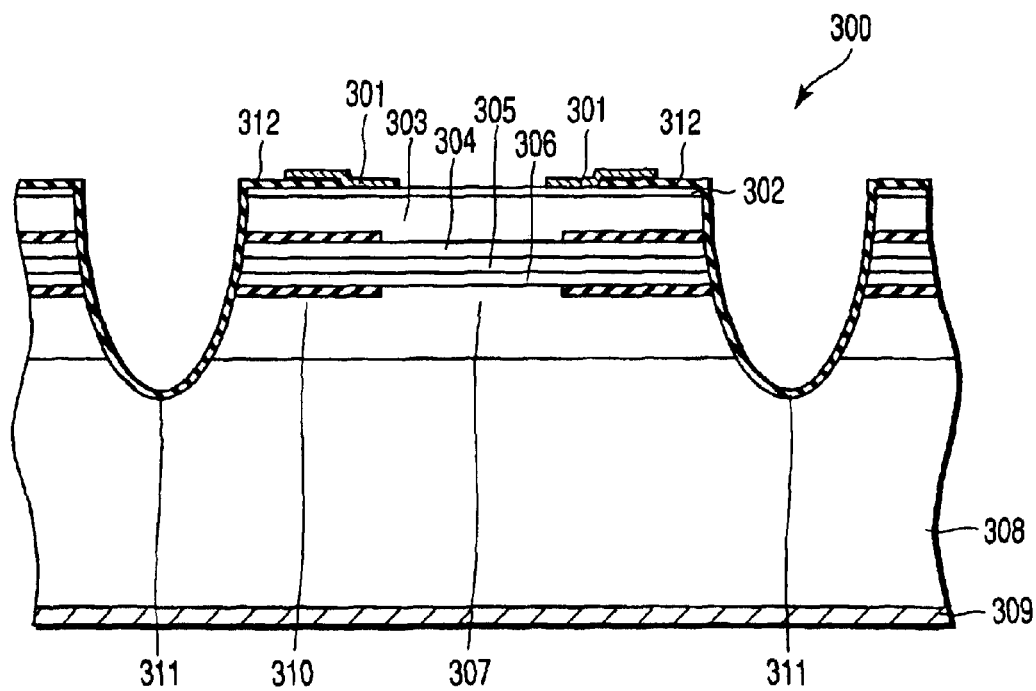
FIG. 6 is a cross-sectional view showing the structure of a resonant-cavity light-emitting diode according to a third embodiment of this invention.

FIG. 6 is a cross-sectional view showing the schematic structure of a resonant-cavity light-emitting diode 300 according to a third embodiment of this invention. As in the first embodiment, the third embodiment is also a red resonant-cavity light-emitting diode having a light emission wavelength of approximately 665 nm and using an InGaAlP-based multiple quantum well structure as an active layer.

In the resonant-cavity light-emitting diode 300 according to the third embodiment, an n-type AlGaAs-based DBR mirror 307, an n-type InGaAlP cladding layer 306, an InGaAlP-based multiple quantum well active layer 305 which is adjusted to have a light emission peak wavelength of 655 nm, a p-type InGaAlP cladding layer 304, an AlGaAs-based p-type DBR mirror 303 and a p-type GaAs contact layer 302 are sequentially grown on one main surface of an n-type GaAs substrate 308 by an MOCVD method. The total optical film thickness of the cladding layers and multiple quantum well active layers is set to be coincident with the resonant wavelength (665 nm).

In the AlGaAs-based DBR mirrors 303 and 307, a structure in which layers of $Al_{0.98}Ga_{0.02}As$ and $Al_{0.5}Ga_{0.5}As$ are alternately accumulated and the optical film thickness of each layer is set to be ¼ the resonant wavelength (665 nm).

In the n-side DBR mirror layer 307, the layers of $Al_{0.98}Ga_{0.02}As$ and $Al_{0.5}Ga_{0.5}As$ are repeatedly accumulated 30 times starting from $Al_{0.98}Ga_{0.02}As$, and the last layer of the DBR mirror layer 307 closest to the InGaAlP-based multiple quantum well active layer 305 is formed of an AlAs layer which forms a selectively oxidized layer 310, as will be described later.

On the other hand, in the p-side DBR mirror layer 303, a structure is used in which the first layer thereof closest to the InGaAlP-based multiple quantum well active layer 305 is formed of an AlAs layer which forms the selectively oxidized layer 310, and the layers of $Al_{0.98}Ga_{0.02}As$ and $Al_{0.5}Ga_{0.5}As$ are repeatedly accumulated 9.5 times starting from $Al_{0.5}Ga_{0.5}As$, the last layer being formed of $Al_{0.5}Ga_{0.5}As$. Thus, the resonant wavelength of a cavity structure configured by the DBR mirrors below and above the active layer is set to 665 nm.

The respective semiconductor layers ranging from the surface of the p-type GaAs contact layer 302 which is the top layer of the semiconductor layers to the GaAs substrate 308 are selectively etched to form a ring-form groove 311 with a substantially U-shaped cross section having an inner diameter of 100 μm and an outer diameter of 140 μm in the surface of the p-type GaAs contact layer 302.

Further, each of the AlAs layers formed in the DBR mirrors above and below the active layer is oxidized in a lateral direction from the exposed portion of the groove 311 by heat treatment in the vapor atmosphere, and is formed into the selectively oxidized layer 310 in a region except for a circular region having a diameter of 70 μm from the center of the ring-form groove 311, and a current confinement portion is provided.

After the selectively oxidized layers 310 are formed, the surface in the groove 311 and the surface of the p-type GaAs contact layer 302 are covered with an $SiO_2$ film 312 deposited by the CVD method. However, at least in a range with a diameter of 70 μm on the current confinement portion surrounded by the selectively oxidized layers 310, the $SiO_2$ film 312 is partly removed in a circular form and the surface of the p-type GaAs contact layer 302 is exposed and used as an emitted light extraction portion.

Further, around the emitted light extraction portion on the surface of the p-type GaAs contact layer 302, a ring-form p-side electrode 301 having an inner diameter of 60 μm and an outer diameter of 80 μm in the surface region and a bonding pad having a connecting portion for connection with the p-side electrode 301 on the SiO$_2$ film 312 which lies outside the groove 311 are each formed as a metal layer of TiPtAu, for example. Finally, the rear surface is polished and an n-side electrode 309 is formed thereon.

As in the first embodiment, in the above resonant-cavity light-emitting diode 300, the light extraction efficiency can be enhanced by use of the groove 311. Further, since the refractive index of the selectively oxidized layers 310 of the AlAs layers provided above and below the light emission layer is small, light emitted into between the upper and lower selectively oxidized layers 310 is confined in a space between the two selectively oxidized layers 310 and can be efficiently extracted from the groove 311 to the outside.

In the first to third embodiments, the diameter of the current confinement potion is set to 62 to 70 μm, but it is not limited to the above values and can be selectively set in a range of 30 to 100 μm. If the diameter is smaller than 30 μm, the light output power becomes insufficient, and if the diameter is larger than 100 μm, the response speed becomes low. Therefore, it is preferable to set the diameter of the current confinement potion to 50 to 80 μm.

Further, it is preferable to set the inner diameter of the groove surrounding the current confinement portion to a value obtained by adding 30 μm to the selected diameter of the current confinement portion and set the outer diameter of the groove to a value obtained by adding 40 μm to the inner diameter thereof (that is, the groove width of 20 μm).

The size of the light emission diode chips 100, 200, and 300 is approximately 300 μm×(200 to 250) μm.

Further, as the material of the semiconductor light emission layer, a material of $In_{1-x}(Ga_{1-y}Al_y)_xP$ ($0 \leq x, y \leq 1$) can be used and the light emission wavelength can be selected in a range of 620 to 690 nm.

(Fourth Embodiment)

A fourth embodiment is an optical transmission module obtained by combining the red resonant-cavity light-emitting diode according to one of the first to third embodiments and a plastic optical fiber.

Figure 7:
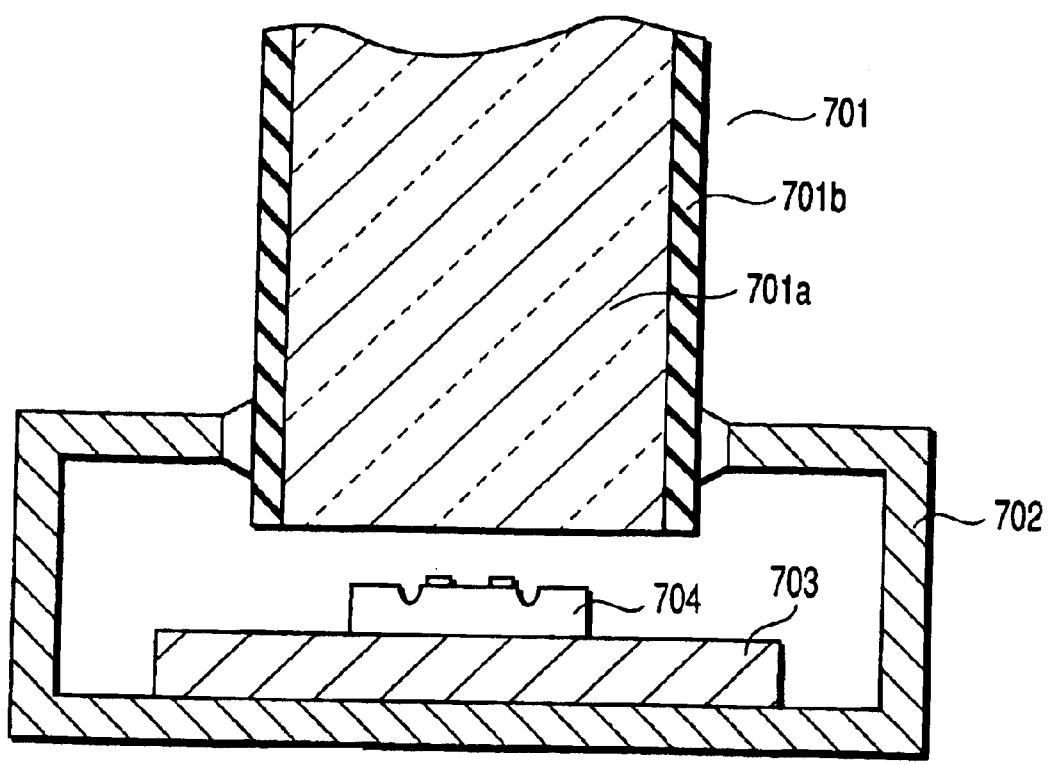
FIG. 7 is a cross-sectional view showing the main portion of an optical transmission module according to a fourth embodiment of this invention.

FIG. 7 is a cross-sectional view showing the main structure of an optical coupler of the optical transmission module according to the fourth embodiment. A red resonant-cavity light-emitting diode 704 having a light extraction groove formed therein and described in the first to third embodiments is mounted on a sub-mount 703 which is also used as a heat sink and incorporated into a package 702.

A plastic optical fiber 701 formed to extend from directly above the red resonant-cavity light-emitting diode 704 in a direction opposite to the sub-mount 703 is optically aligned and coupled with the package 702 so that the center of light emitted from the red resonant-cavity light-emitting diode 704 will coincide with the central axis of a core section 701a.

The chip size of the red resonant-cavity light-emitting diode 704 incorporated in the optical transmission module is approximately 250 μm×310 μm, and the diameter of the emitted light extraction portion of a p-side electrode is 70 μm and the outer diameter of the groove surrounding the peripheral portion thereof is 150 μm.

A multi-step index type fiber is used as the plastic optical fiber 701. The core diameter of the multi-step index type plastic optical fiber is 700 μm and the outer diameter of a cladding portion 701b is 750 μm.

Therefore, the core diameter of the plastic optical fiber is equal to or larger than four times the total diameter of the light emission portion containing the groove of the red resonant-cavity light-emitting diode 704 and a sufficiently large portion of light emitted from the red resonant-cavity light-emitting diode 704 toward the plastic optical fiber 701 is incident on the core portion 701a.

Further, since the plastic optical fiber has a small loss in the red wavelength band, the combination thereof with the red resonant-cavity light-emitting diode of the first to third embodiments becomes suitable.

In the optical transmission module with the above structure, the transmission distance can be made longer with an increase in the light output power of a light source in comparison with a conventional optical transmission module using a light-emitting diode. In FIG. 7, only the main structure of the optical coupler used as the module is shown, but optical parts such as a driving IC and lens, mold resin and the like can be contained as constituent elements.

In each of the above embodiments, the red resonant-cavity light-emitting diode is explained, but this invention is not limited to red light and can be applied to resonant-cavity light-emitting diodes of various light emission wavelengths.

As described above, according to the embodiments, since the groove which reaches the DBR mirror on the substrate side is formed in the peripheral portion of the light emission region of the resonant-cavity light-emitting diode, light which is part of light emitted by current injection and spreads in a direction toward the side surface of the device can be extracted toward the front surface side of the device via the groove. Thus, the light extraction efficiency of the resonant-cavity light-emitting diode is improved and the light output power is increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical transmission module comprising:
   a resonant-cavity light-emitting diode, said resonant-cavity light-emitting diode including:
      a substrate having a first main surface and a second main surface which are substantially parallel to each other,
      a first semiconductor distributed Bragg reflector mirror layer formed on said first main surface of said substrate,
      a semiconductor light-emitting layer formed over said first semiconductor distributed Bragg reflector mirror layer,
      a second semiconductor distributed Bragg reflector mirror layer formed over said semiconductor light-emitting layer,
      a light extraction section which is formed on said second semiconductor distributed Bragg reflector mirror layer and has an opening to extract light from said semiconductor light-emitting layer,
      a first electrode formed around said light extraction section on said second semiconductor distributed Bragg reflector mirror layer, a second electrode formed on said second main surface of said substrate, and a reflector portion provided on an inner wall of a groove, said groove being formed by removing portions of said first semiconductor distributed Bragg reflector mirror layer, said semiconductor light-emitting layer and said second semiconductor distributed Bragg reflector mirror layer which lie in a peripheral portion of said first electrode and formed to penetrate through each of said semiconductor light-emitting layer reflector mirror layer and said second semiconductor distributed Bragg reflector layer and reach said first semiconductor distributed Bragg reflector mirror layer, said reflector portion being formed to reflect part of light emitted from said semiconductor light-emitting layer into said groove; and an optical fiber on which light from said light extraction section and groove of said resonant-cavity light-emitting diode is incident.

2. The optical transmission module according to claim 1, wherein said groove of said resonant-cavity light-emitting diode is configured in substantially a ring form and a diameter of a light-receiving end surface of said optical fiber is larger than that of said ring of said ring-form groove.

3. The optical transmission module according to claim 1, wherein said reflector portion of said groove of said resonant-cavity light-emitting diode is configured with a concave surface with respect to light from said semiconductor light-emitting layer.

4. The optical transmission module according to claim 1, wherein said reflector portion includes a reflection film which is formed on an inner wall portion of said groove and reflects light from said semiconductor light-emitting layer.

5. The optical transmission module according to claim 1, wherein said semiconductor light-emitting layer of said resonant-cavity light-emitting diode includes an active layer using an $In_{1-x}(Ga_{1-y}Al_y)_xP$-series material ($0 \leq x, y \leq 1$) and a light emission wavelength thereof is 620 to 690 nm.

6. The optical transmission module according to claim 1, further comprising a high-resistance region which is formed to reach said inner wall of said groove and formed by making portions of said first semiconductor distributed Bragg reflector mirror layer and said second semiconductor distributed Bragg reflector mirror layer of said resonant-cavity light-emitting diode other than at least portions thereof which lie just below said opening of said light extraction section electrically highly resistive.

7. The optical transmission module according to claim 6, wherein each of said first semiconductor distributed Bragg reflector mirror layer and said second semiconductor distributed Bragg reflector mirror layer of said resonant-cavity light-emitting diode includes a semiconductor layer with a high Al composition ratio and said high-resistance region is formed by selectively oxidized part of said semiconductor layer in a lateral direction from said groove.

* * * * *